US012696543B2

(12) United States Patent
Chang et al.

(10) Patent No.: US 12,696,543 B2
(45) Date of Patent: Jul. 28, 2026

(54) DRIVING CIRCUIT FILM AND DISPLAY DEVICE HAVING THE SAME

(71) Applicant: E Ink Holdings Inc., Hsinchu (TW)

(72) Inventors: Yung-Sheng Chang, Hsinchu (TW);
Wei-Tsung Chen, Hsinchu (TW);
Yu-Lin Wang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 926 days.

(21) Appl. No.: 17/810,347

(22) Filed: Jul. 1, 2022

(65) Prior Publication Data

US 2023/0005963 A1 Jan. 5, 2023

Related U.S. Application Data

(60) Provisional application No. 63/217,751, filed on Jul. 1, 2021.

(51) Int. Cl.
*H10D 86/60* (2025.01)
*H10D 30/67* (2025.01)
*H10D 86/40* (2025.01)

(52) U.S. Cl.
CPC ......... *H10D 86/60* (2025.01); *H10D 30/6745* (2025.01); *H10D 30/6755* (2025.01); *H10D 86/411* (2025.01); *H10D 86/423* (2025.01); *H10D 86/441* (2025.01)

(58) Field of Classification Search
CPC ................................. H10D 86/60; G09G 3/20
See application file for complete search history.

(56) References Cited

U.S. PATENT DOCUMENTS

| | | | |
|---|---|---|---|
| 8,027,009 B2 | 9/2011 | Baek et al. | |
| 10,527,895 B2 | 1/2020 | Yang | |
| 2008/0278646 A1 * | 11/2008 | Chien | G02F 1/1395 |
| | | | 349/39 |
| 2016/0181346 A1 | 6/2016 | Kwon et al. | |
| 2017/0337887 A1 * | 11/2017 | Yonebayashi | G09G 3/3677 |
| 2019/0325797 A1 * | 10/2019 | Kanda | G09G 3/006 |
| 2019/0362685 A1 | 11/2019 | Tsai et al. | |
| 2020/0037442 A1 * | 1/2020 | Keum | H05K 1/0283 |
| 2020/0152913 A1 | 5/2020 | Noh et al. | |
| 2020/0194595 A1 * | 6/2020 | Choi | H10D 30/675 |
| 2021/0333834 A1 * | 10/2021 | Hsu | G02F 1/13452 |

(Continued)

FOREIGN PATENT DOCUMENTS

| | | |
|---|---|---|
| CN | 1844977 A | 10/2006 |
| CN | 101682987 A | 3/2010 |

(Continued)

OTHER PUBLICATIONS

The office action of corresponding CN application No. 202210773494.1 issued on Jan. 20, 2025.

(Continued)

*Primary Examiner* — Aaron J Gray
(74) *Attorney, Agent, or Firm* — CKC & Partners Co., LLC

(57) ABSTRACT

A driving circuit film configured to be bond at a periphery region of a display panel. The driving circuit film includes a flexible substrate, a gate driving circuit and a source driver. The gate driving circuit is disposed on the flexible substrate, and the gate driving circuit includes a Thin-Film Transistor. The source driver is disposed on the flexible substrate.

17 Claims, 5 Drawing Sheets

(56)                    References Cited

U.S. PATENT DOCUMENTS

2021/0409584 A1*  12/2021  Kojima .................. H04N 23/55
2022/0216240 A1*   7/2022  Hosaka ................ H10K 59/131

FOREIGN PATENT DOCUMENTS

| CN | 104115212 A | 10/2014 |
|----|-------------|---------|
| CN | 104680967 A | 6/2015 |
| CN | 105741784 A | 7/2016 |
| CN | 106449976 A | 2/2017 |
| CN | 111798755 A | 10/2020 |
| TW | I682516 B | 1/2020 |

OTHER PUBLICATIONS

The office action of corresponding TW application No. 111124665
issued on Oct. 25, 2022.
The office action of corresponding CN application No. 202210773494.1
issued on Jun. 25, 2025.

* cited by examiner

10

DRIVING CIRCUIT FILM AND DISPLAY DEVICE HAVING THE SAME

CROSS-REFERENCE TO RELATED APPLICATION

This application claims priority to U.S. Provisional Application Ser. No. 63/217,751, filed Jul. 1, 2021, which is herein incorporated by reference in its entirety.

BACKGROUND

Field of Invention

The present invention relates to a driving circuit film and a display device.

Description of Related Art

The display device is manufactured through Chip on Glass process currently. The gate driver and the source driver are disposed at border of the display device. However, space in the periphery region for disposing the gate driver and the source driver are required. Therefore, it is difficult to manufacture a display device having four narrow borders.

Accordingly, it is still a development direction for the industry to provide a display device that can solve the problems mentioned above.

SUMMARY

The invention provides a driving circuit film configured to be bond at a periphery region of a display panel.

In some embodiments, the driving circuit film includes a flexible substrate, a gate driving circuit and a source driver. The gate driving circuit is disposed on the flexible substrate, and the gate driving circuit includes a Thin-Film Transistor. The source driver is disposed on the flexible substrate.

In some embodiments, a driving circuit of the gate driving circuit is directly formed on the flexible substrate through a deposition process.

In some embodiments, the Thin-Film Transistor is Low Temperature Poly-silicon Thin-Film Transistor or Oxide Thin-Film Transistor.

In some embodiments, the driving circuit film further includes a flexible print circuit board, and the flexible substrate includes a first side and a second side. The first side is configured to be bonded at the periphery region of the display panel, the second side is configured to connect with the flexible print circuit board.

In some embodiments, an area of the flexible substrate is greater than an area of the flexible print circuit board.

Another aspect of the present disclosure is a display device.

The display device includes a display panel and a driving circuit film. The display panel includes a display region and a periphery region surrounding the display region. The driving circuit film is configured to be bond at a periphery region of a display panel, and the driving circuit film includes a flexible substrate, a gate driving circuit and a source driver. The gate driving circuit is disposed on the flexible substrate, and the gate driving circuit includes a Thin-Film Transistor. The source driver is disposed on the flexible substrate.

In some embodiments, the gate driving circuit and the source driver are located outside the periphery region of the display panel.

In some embodiments, the display panel includes a data line, a scan line, and a selection line, the data line and the selection line extend along a first direction, and the scan line extends along a second direction perpendicular to the first direction.

In some embodiments, the selection line is electrically connected with the scan line, the selection line is electrically connected to the gate driving circuit, and the data line is electrically connected to the source driver.

In some embodiments, the display panel includes a data line, a scan line, and a selection line, the gate line and the selection line extend along a first direction, and the data line extends along a second direction perpendicular to the first direction.

In some embodiments, the selection line is electrically connected with the data line, the selection line is electrically connected to the data driving circuit, and the gate line is electrically connected to the gate driver.

In some embodiments, the gate driving circuit is located between the display region and the source driver, and the data line extends and passes through the gate driving circuit.

In some embodiments, the gate driving circuit includes a channel, and the data lines is located in the channel.

In some embodiments, the driving circuit film further includes a voltage level shift disposed on the flexible substrate.

In some embodiments, the driving circuit film further includes a flexible print circuit board.

In some embodiments, the display device further includes a driving panel circuit configured to provide signal circuit or power circuit.

In some embodiments, the driving panel circuit is electrically connected to the flexible substrate through the flexible print circuit board.

In some embodiments, the driving panel circuit is directly connected to the flexible substrate.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
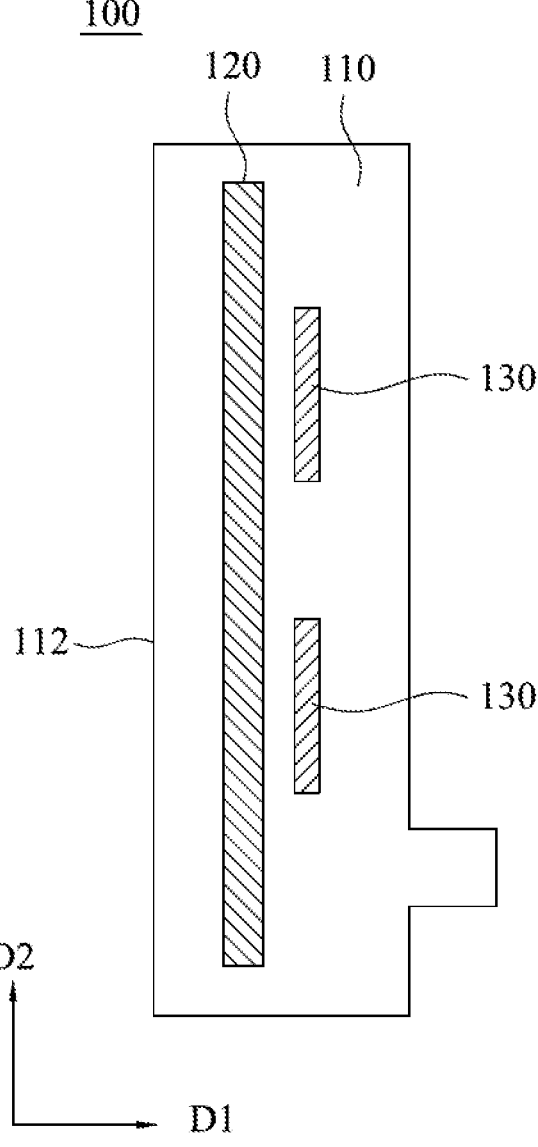
FIG. 1 is a top view of a driving circuit film according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a top view of a driving circuit film 100 according to one embodiment of the present disclosure. The driving circuit film 100 includes a flexible substrate 110, a gate driving circuit 120, and a source driver 130. The gate driving circuit 120 and the source driver 130 are both disposed on the flexible substrate 110. For example, the flexible substrate 110 is a film formed by Polyimide (PI). The gate driving circuit 120 includes Low Temperature Poly-silicon Thin-Film Transistor (LTPS-TFT) or Oxide Thin-Film Transistor.

A driving circuit (not shown) of the gate driving circuit 120 is directly formed on the flexible substrate 110 through a deposition process, and the gate driving circuit 120 is not an integrated circuit (IC). The gate driving circuit 120 is not bonded to the display panel 200 with electrical connection elements (e.g., conductive bumps or solder balls) through soldering. The source driver 130 is an integrated circuit. The source driver 130 is electrically connected to the flexible substrate 110 through electrical connection elements.

Specifically, by using the LTPS-TFT as an example, the manufacturing process of the gate driving circuit 120 may start by supporting the flexible substrate 110 temporarily with a carrier. Depositing a barrier layer on the flexible substrate 110 to avoid damage from laser light in the subsequent laser process. Continuously, the amorphous silicon (a-Si) material is deposited on the barrier layer, and the amorphous silicon material is transformed to the poly-silicon material through laser at low temperature. Lastly, the flexible substrate 110 is separated from the carrier through laser. In other words, design of the driving circuit film 100 of the present disclosure combines a thin film transistor and a driver on the same flexible substrate 110.

In a conventional chip on film (COF) process, a gate driver and a source driver are bonded on a flexible printed circuit board (FPC) through electrical connection element. However, it is difficult to reduce circuit pitch in a COF process, and therefore the circuit line precision of the driver boned on the flexible printed circuit board is limited.

In other words, the present disclosure can replace the conventional chip on film process by directly forming the gate driving circuit 120 on the flexible substrate 110. Since the process precision of the LTPS-TFT or the oxide TFT is higher, the circuit pitch of the gate driving circuit 120 is more precise. The interval between the electrical connection elements of the source driver 130 disposed on the flexible substrate 110 (e.g., interval between the bumps) can be reduced to about 10 um. Therefore, design of the driving circuit film 100 have advantages like volume reduction, weight reduction and folding freely.

Figure 2:
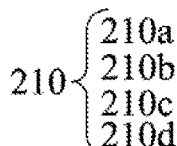
FIG. 2 is a top view of a display device according to one embodiment of the present disclosure.

FIG. 2 is a top view of a display device 10 according to one embodiment of the present disclosure. The display device 10 includes a display panel 200 and the driving circuit film 100 shown in FIG. 1. The display panel 200 includes a display region DR and a periphery region PR. The periphery region PR surrounds the display region DR. The periphery region PR of the display panel 200 includes a frame 210. The frame 210 are formed by four borders 210a-210d. The flexible substrate 110 of the driving circuit film 100 has a first side 112. The first side 112 of the driving circuit film 100 is configured to be bonded at the border 210a at the right-hand side of the display panel 200. In other words, the gate driving circuit 120 and the source driver 130 are located at the same side of the display panel 200. In addition, the gate driving circuit 120 and the source driver 130 are both located outside the periphery region PR of the display panel 200.

The display device 10 of the present embodiment can be Electro-Phoretic Display (EPD). In other embodiment, the display device can be reflective display such as Liquid Crystal Display (LCD) or Organic Electrical Luminescence (OLED).

In a chip on glass (COG) process, the gate driver and a source driver are bonded on the glass in the periphery region through conductive adhesive. Therefore, the gate driver and the source driver need to be electrically connected with the conductive pads on the glass backplate through conductive connection elements (e.g., conductive bumps). Space in the periphery region for disposing the gate driver and the source driver are required in the chip on glass process. Accordingly, compared to the conventional chip on glass process, the gate driving circuit 120 and the source driver 130 are located on the flexible substrate 110 but not the frame 210 of the periphery region PR of the display panel 200. Therefore, the width T1 of the border 210a of the display panel 200 can be reduced.

Figure 3:
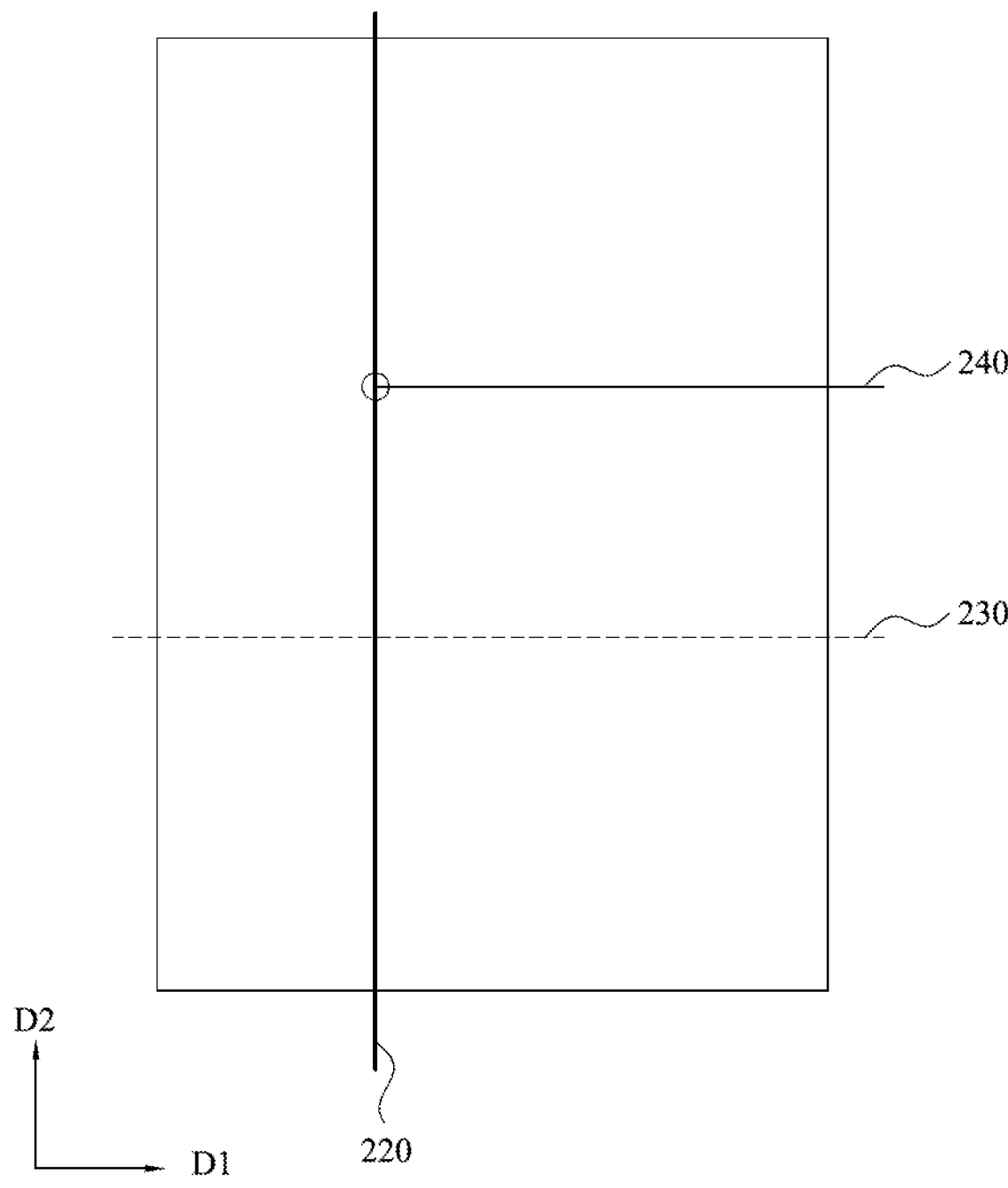
FIG. 3 is a partial top view of the display region of the display device according to one embodiment of the present disclosure.

FIG. 3 is a partial top view of the display region DR of the display device according to one embodiment of the present disclosure. Reference is made to FIG. 2 and FIG. 3. The display region DR of the display panel 200 includes a pixel array formed by multiple signal lines. In FIG. 2, a scan line 220, a data line 230, and a selection line 240 are used as example. The data line 230 and the selection line 240 extend along the first direction D1, and the scan line 220 extends along the second direction D2. The second direction D2 is perpendicular to the first direction D1. In the present embodiment, the selection line 240 is electrically connected with the scan line 220.

In the present embodiment, the selection line 240 is electrically connected with the gate driving circuit 120, and the data line 230 is electrically connected with the source driver 130. The scan line 220 extending along the second direction D2 is electrically connected to the gate driving circuit 120 through selection line 240. In other words, the signal transferred along the second direction D2 can be transferred along the first direction D1 through the selection line 240. Therefore, such circuit design can make the gate driving circuit 120 and the source driver 130 be disposed at the same side of the display panel 200.

The circuit design shown in FIG. 3 is T-wire TFT array design. In other embodiment, the data line 230 can be electrically connected to the source driver 130 through the selection line 240. That is, the T-wire TFT array design can be achieved by electrically connecting the data line 230 and the selection line extending along the second direction D2. As such, the signal transferred along the first direction D1 can be transferred along the second direction D2 through the selection line extending along the second direction D2. Under this condition, the driving circuit film 100 can be bonded to the border 210b (see FIG. 2) of the periphery region PR. In other words, those configurations are available as long as the circuits electrically connected with the gate driving circuit 120 and the source driver 130 extend along the same direction to make the gate driving circuit 120 and the source driver 130 be disposed at the same side of the periphery region PR of the display panel 200.

As shown in FIG. 2, in the present embodiment, the border 210b at the bottom of the display panel 10 has a width T2, the border 210c at the left-hand side of the display panel 10 has a width T3, and the border 210d at the right-hand side of the display panel 10 has a width T4. Since the gate driving circuit 120 and the source driver 130 are disposed at the border 210a of the display panel 200, the widths T2-T4 are reduced. For example, the widths T2~T4 of the border 210b, the border 210c, and the border 210d are about 1 mm to 5 mm. In addition, only the space for disposing the driving circuit film 100 is required, and there is no space for disposing the gate driving circuit 120 and the source driver

130. Therefore, the width T1 of the border 210*d* at the right-hand side can be reduced to a range of 4 mm to 6 mm as well.

As described above, the display panel 200 can have four narrow borders by combining the driving circuit film 100 and the T-wire TFT array design. In addition, the driving circuit film 100 can have advantages such as precise circuit pitch which can achieved in COG process, volume reduction, weight reduction and folding freely which can achieved in COF process.

Figure 4:
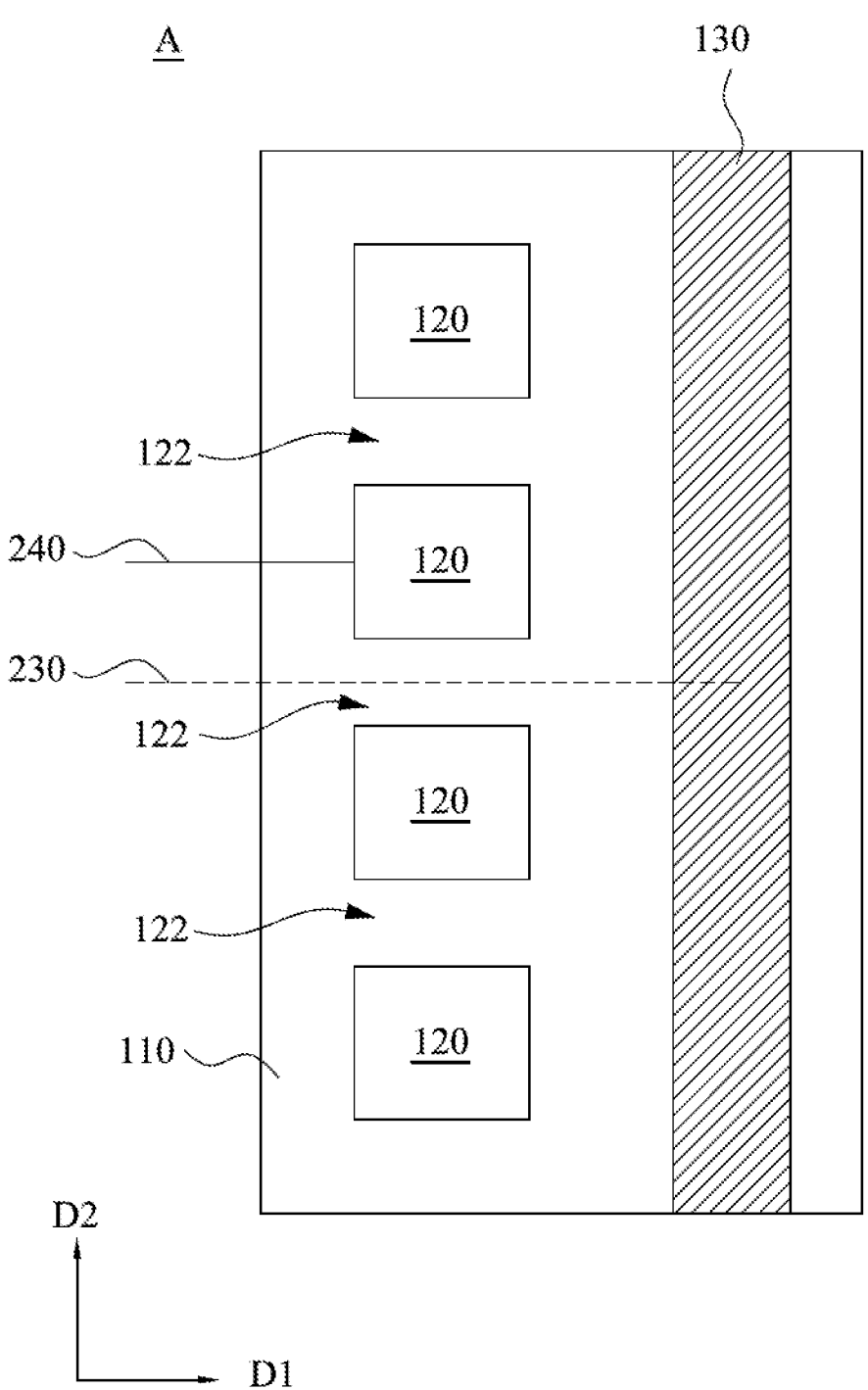
FIG. 4 is an enlarged view of the region in FIG. 2.

FIG. 4 is an enlarged view of the region A in FIG. 2. The region A is illustrated the enlarged view of the gate driving circuit 120 and the source driver 130 of the driving circuit film 100. In the present embodiment, the gate driving circuit 120 of the driving circuit film 100 has multiple sections that are separated from each other. Channels 122 are formed between adjacent sections. The data line 230 passes through the channel 122 and is connected to the source driver 130 from the left-side of the gate driving circuit 120. As described above, since the gate driving circuit 120 can be directly formed on the flexible substrate 110 through a TFT process, the exposure and develop process for forming the channel 122 can be combined in the process of forming the gate driving circuit 120. In other words, the trace arrangement between the electrical connection of the data line 230 and the source driver 130 is not limited by the positions of the gate driving circuit 120 and the source driver 130. Accordingly, such design can improve the circuit pitch precision of the gate driving circuit 120 and the source driver 130 and the trace arrangement. It is noted that, the number and the arrangement of the channels 122 of the gate driving circuit 120 in FIG. 4 are merely demonstrated as examples, and a person having ordinary skill in the art may adjust the number and arrangement of the channels 122 based on practical requirements.

Figure 5:
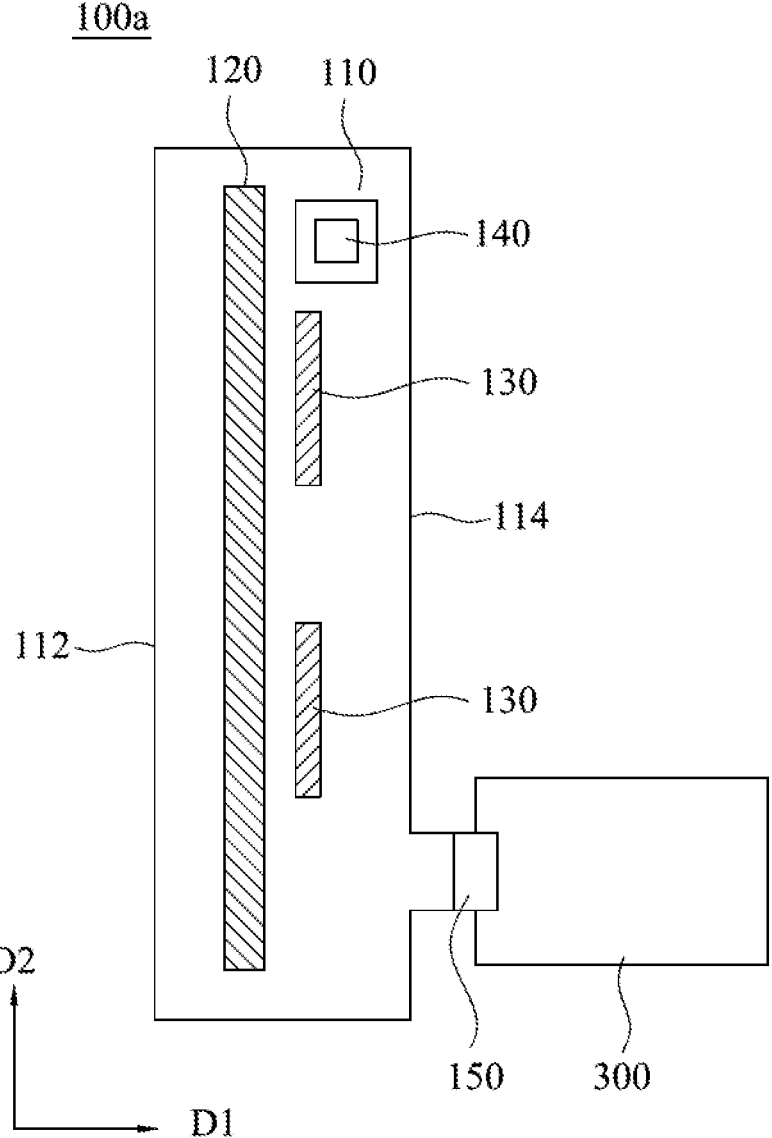
FIG. 5 is a top view of the driving circuit film according to one embodiment of the present disclosure.

FIG. 5 is a top view of the driving circuit film 100*a* according to one embodiment of the present disclosure. The driving circuit film 100*a* has a level shift 140. The level shift 140 is electrically connected with the gate driving circuit 120. The level shift 140 can support shifting the output voltage of the gate driving circuit 120. In other embodiment, the level shift 140 can also be disposed on a driving panel circuit 300.

The driving circuit film 100*a* has a flexible printed circuit board 150. The flexible substrate 110 has a second side 114 opposite to the first side 112. The second side 114 is configured to connect with the flexible printed circuit board 150. In the present embodiment, the flexible printed circuit board 150 is configured to provide mechanical strength when the flexible substrate 110 is electrically connected to the driving panel circuit 300. The driving panel circuit 300 aforesaid is configured to provide signal circuit or power circuit. The driving panel circuit 300 can be electrically connected to the flexible substrate 110 through the flexible printed circuit board 150, or be directly connected to the flexible substrate 110. As shown in FIG. 5, the area of the flexible substrate 110 is greater than the area of the flexible printed circuit board 150. In other words, the flexible printed circuit board 150 can be used as a connector herein. In some embodiments, the level shift 140 can be disposed on the driving panel circuit 300 and electrically connected with the gate driving circuit 120.

In summary, the driving circuit film can have advantages such as precise circuit pitch which can achieved in COG process, volume reduction, weight reduction and folding freely which can achieved in COF process.

The display panel can have four narrow borders by combining the driving circuit film and the T-wire TFT array design so as to dispose the gate driving circuit and the source driver at the same side of the periphery region PR of the display panel.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A driving circuit film, configured to be bond at a periphery region of a display panel, wherein the driving circuit film comprises:

a flexible substrate;

a gate driving circuit disposed on the flexible substrate, wherein the gate driving circuit includes a Thin-Film Transistor; and a source driver, which is an integrated circuit, disposed on the flexible substrate, wherein the driving circuit film has no display region, wherein a driving circuit of the gate driving circuit is directly formed on the flexible substrate through a deposition process.

2. The driving circuit film of claim 1, wherein the Thin-Film Transistor is Low Temperature Poly-silicon Thin-Film Transistor or Oxide Thin-Film Transistor.

3. The driving circuit film of claim 1, further comprising a flexible print circuit board, wherein the flexible substrate comprises a first side and a second side, the first side is configured to be bonded at the periphery region of the display panel, the second side is configured to connect with the flexible print circuit board.

4. The driving circuit film of claim 3, wherein an area of the flexible substrate is greater than an area of the flexible print circuit board.

5. A display device, comprising:

a display panel comprising a display region and a periphery region surrounding the display region; and a driving circuit film configured to be bond at a periphery region of a display panel, wherein the driving circuit film is located outside the display region of the display panel, and the driving circuit film comprises:

a flexible substrate;

a gate driving circuit disposed on the flexible substrate, wherein the gate driving circuit includes a Thin-Film Transistor, wherein a driving circuit of the gate driving circuit is directly formed on the flexible substrate through a deposition process; and a source driver, which is an integrated circuit, disposed on the flexible substrate.

6. The display device of claim 5, wherein the gate driving circuit and the source driver are located outside the periphery region of the display panel.

7. The display device of claim 5, wherein the display panel comprises a data line, a scan line, and a selection line, the data line and the selection line extend along a first direction, and the scan line extends along a second direction perpendicular to the first direction.

8. The display device of claim 7, wherein the selection line is electrically connected with the scan line, the selection line is electrically connected to the gate driving circuit, and the data line is electrically connected to the source driver.

9. The display device of claim 5, wherein the display panel comprises a data line, a scan line, and a selection line, the scan line and the selection line extend along a first direction, and the data line extends along a second direction perpendicular to the first direction.

10. The display device of claim 9, wherein the selection line is electrically connected with the data line, the selection line is electrically connected to the gate driving circuit, and the data line is electrically connected to the source driver.

11. The display device of claim 7, wherein the gate driving circuit is located between the display region and the source driver, and the data line extends and passes through the gate driving circuit.

12. The display device of claim 11, wherein the gate driving circuit comprises a channel, and the data line is located in the channel.

13. The display device of claim 5, further comprising a voltage level shift disposed on the flexible substrate.

14. The display device of claim 5, wherein the driving circuit film further comprises a flexible print circuit board.

15. The display device of claim 14, further comprising a driving panel circuit configured to provide a signal circuit or a power circuit.

16. The display device of claim 15, wherein the driving panel circuit is electrically connected to the flexible substrate through the flexible print circuit board.

17. The display device of claim 15, wherein the driving panel circuit is directly connected to the flexible substrate.

\* \* \* \* \*